(12) United States Patent
Arsovski et al.

(10) Patent No.: US 9,472,269 B2
(45) Date of Patent: Oct. 18, 2016

(54) STRESS BALANCING OF CIRCUITS (71) Applicant: INTERNATIONAL BUSINESS MACHINES CORPORATION, Armonk, NY (US)

(72) Inventors: Igor Arsovski, Williston, VT (US); Nathaniel R. Chadwick, Lowell, MA (US); John B. Deforge, Barre, VT (US); Ezra D. B. Hall, Richmond, VT (US); Kirk D. Peterson, Jericho, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 164 days.

(21) Appl. No.: 14/178,955

(22) Filed: Feb. 12, 2014

(65) Prior Publication Data

US 2015/0228357 A1  Aug. 13, 2015

(51) Int. Cl.
  G11C 11/419 (2006.01)
  G11C 29/06 (2006.01)

(52) U.S. Cl.
  CPC ............. *G11C 11/419* (2013.01); *G11C 29/06* (2013.01)

(58) Field of Classification Search
  None
  See application file for complete search history.

(56) References Cited

U.S. PATENT DOCUMENTS

| | | | |
|---|---|---|---|
| 5,828,614 A | 10/1998 | Gradinariu | |
| 6,501,692 B1 | 12/2002 | Melanson et al. | |
| 6,545,943 B2 | 4/2003 | Mizugaki et al. | |
| 7,009,905 B2 | 3/2006 | Aipperspach et al. | |
| 7,225,375 B2 | 5/2007 | Cochran et al. | |
| 7,551,477 B2 | 6/2009 | Mokhlesi et al. | |
| 7,619,914 B2 | 11/2009 | Ito | |
| 7,835,196 B2 | 11/2010 | Noda | |
| 8,198,158 B2 | 6/2012 | Lowrey | |
| 8,363,487 B2 | 1/2013 | Ehrenreich et al. | |
| 2003/0179642 A1* | 9/2003 | Winograd | G06F 13/4086 365/189.011 |
| 2005/0134360 A1 | 6/2005 | Aipperspach | |
| 2009/0083495 A1 | 3/2009 | Khellah et al. | |
| 2010/0046276 A1 | 2/2010 | Chen et al. | |
| 2011/0103159 A1 | 5/2011 | Noorlag | |
| 2012/0069684 A1 | 3/2012 | Douzaka et al. | |
| 2012/0250439 A1 | 10/2012 | Noorlag | |

FOREIGN PATENT DOCUMENTS

JP       2012059330       3/2012

OTHER PUBLICATIONS

Majhi et al., "Memory Testing Under Different Stress Conditions: An Industrial Evaluation", Proceedings of the Design, Automation and Test in Europe Conference and Exhibition, IEEE 2005; 6 Pages.

* cited by examiner

*Primary Examiner* — Paresh Patel
(74) *Attorney, Agent, or Firm* — Anthony Canale; Andrew M. Calderon; Roberts Mlotkowski Safran Cole & Calderon P.C.

(57) ABSTRACT

Methods, systems, and structures for stress balancing field effect transistors subject to bias temperature instability-caused threshold voltage shifts. A method includes characterizing fatigue of a location in a memory array by skewing a bit line voltage of the location. The method also includes determining that the location is unbalanced based on the characterizing. Further, the method includes inverting a logic state of the location. Additionally, the method includes changing a value of an inversion indicator corresponding to the location.

20 Claims, 8 Drawing Sheets

STRESS BALANCING OF CIRCUITS

FIELD OF INVENTION

The present invention generally relates to stress balancing in transistor circuits. More specifically, the present invention relates stress balancing field effect transistors subject to bias temperature instability-caused threshold voltage shifts.

BACKGROUND

Electronic circuits may remain in one state for long periods of time. For example, during normal operation of the computer system, information may be written to storage circuits (e.g., static random access memory (SRAM)) and seldom, if ever, change. Such conditions can occur both during testing (e.g., voltage stressing) and during actual operation (e.g., storing static information, such as operating system code). As a result of remaining in one state, storage circuits can become stressed (i.e., fatigued).

The stresses on computer chips include negative bias temperature instability (NBTI) and positive bias temperature instability (PBTI) of field effect transistors (FETs). In the past, NTBI was considered the dominant contributor to fatigue (e.g., 90% or more). As such, PTBI was discounted in modeling and simulation of circuits. However, PBTI is becoming a substantial contributor to fatigues as the geometry of FETs is scaled ever-smaller.

An n-channel FET ("NFET") is in a PBTI voltage stress condition when a gate on the NFET is "high" and a source and a drain of the NFET are at a "low" voltage. A p-channel FET ("PFET") is in an NBTI voltage stress condition when its source and the drain are both at a "high" voltage level and the gate is at a "low" voltage level. NBTI and PBTI cause shifts in the threshold voltages of FETs, which result in performance degradation and voltage sensitivity. For example, marginally functional storage cells of an SRAM may fail due to threshold voltage shifts caused by NBTI and PBTI.

SUMMARY

In an aspect of the invention, there is a method for stress balancing circuits. The method includes characterizing fatigue of a location in a memory array by skewing a bit line voltage of the location. The method also includes determining that the location is unbalanced based on the characterizing. Further, the method includes inverting a logic state of the location. Additionally, the method includes changing a value of an inversion indicator corresponding to the location.

In further aspects of the invention, there is a computer program product including a computer usable storage device having a computer readable program stored in the device. The computer readable program, when executed on a computing device, is operable to cause the computing device to determine respective inversion state indicators corresponding to a plurality of locations in a memory array. Additionally, the computer readable program is operable to cause the computing device to determine that a storage location in the memory array is inverted based on a value of the corresponding one of the inversion state indicators. Also, the computer readable program is operable to invert values written to the storage location based on the value of the corresponding one of the inversion state indicators. Further, the computer readable program is operable to invert values read from the storage location based on the corresponding one of the inversion state indicators.

In further aspects of the invention, there is a structure for stress balancing circuits. The structure includes a stress balancing module and an array of storage cells. The array of storage cells includes word lines that are rows of the array and bit lines that are columns of the array. The bit lines have adjustable voltages. Additionally, the structure includes a memory device storing inversion indicators that correspond, respectively, to the word lines. Also, the structure includes output buffers configured to selectively invert the bit lines based on the inversion indicators.

In another aspect of the invention, a design structure tangibly embodied in a machine readable storage medium for designing, manufacturing, or testing an integrated circuit is provided. The design structure comprises structures for stress balancing FETs. In further embodiments, a hardware description language (HDL) design structure encoded on a machine-readable data storage medium comprises elements that when processed in a computer-aided design system generates a machine-executable representation of structures for stress balancing FETs. In still further embodiments, a method in a computer-aided design system is provided for generating a functional design model of structures for stress balancing FETs. The method comprises generating a functional representation of structures for stress balancing FETs.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

DETAILED DESCRIPTION

The present invention generally relates to field effect transistor circuits. More specifically, the present invention relates to field effect transistors subject to bias temperature instability caused threshold voltage shifts. According to aspects of the invention, there is a system and process that alleviates NBTI and PBTI-caused threshold voltage shifts by operating during idle states of a storage circuit. More specifically, embodiments of the invention characterize the stress of storage circuits during idle cycles, determine inversion states for the storage circuits, and apply an inversion state to actively reduce NBTI and PBTI.

Additionally, in accordance with aspects of the invention, inversion states of the storage circuits are hidden from underlying code operation of a system such that program code of the system does not need to be modified to accommodate the applied inversion states. That is, when a particular storage location is inverted, embodiments of the invention transparently invert values upon read and write operations of that storage location.

Figure 1:
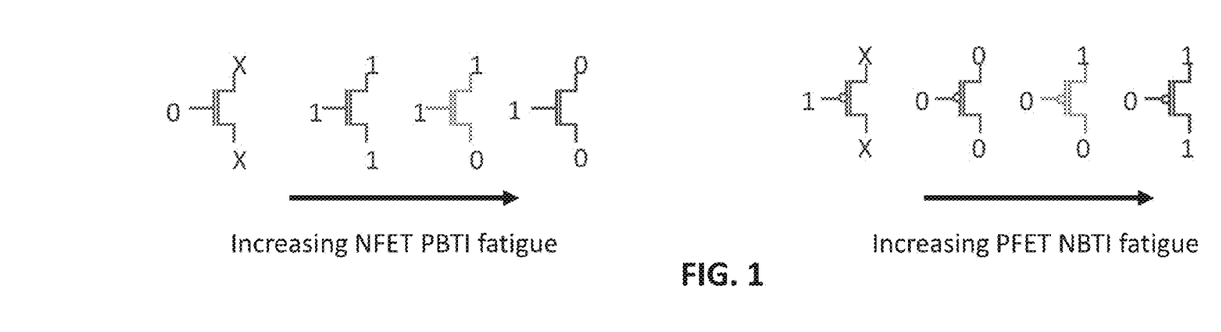
FIG. 1 shows voltage states that place differing amounts of stress on NFETs and PFETs.

FIG. 1 shows voltage states that place differing amounts of stress on NFETs and PFETs. Different voltage states place differing amounts of stress on NFETs and PFETs. That is, FIG. 1 shows degrees of increasing stress for an NFET and a PFET, respectively, for different terminal voltages. The stress increases from the leftmost state to the rightmost state. For example, in a CMOS chip having a 1-volt supply voltage, a PFET is in the greatest NBTI voltage stress condition when its source and its drain are at 1-volt (i.e., "high" digital logic state) and its gate is at 0-volts (i.e., "low" digital logic state). When the gate is "high," the PFET tends to recover from NBTI-caused threshold voltage degradation.

Figure 2:
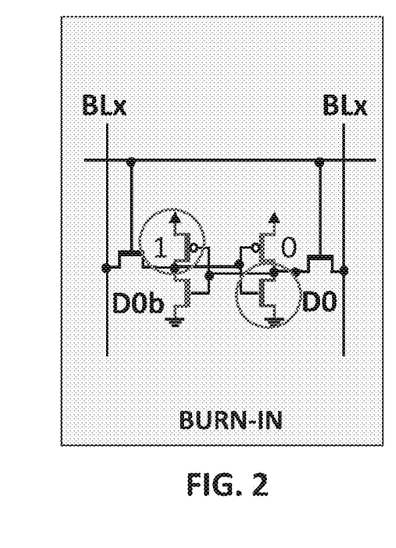
FIG. 2 shows the magnitude of threshold voltage shift at the worst case stress conditions for an exemplary storage cell.

The voltage state of the transistor terminals during operation determines the relative degree of degradation a FET experiences due to stress. FIG. 2 identifies the devices which see the greatest NBTI/PBTI stress with D0b=high/D0=low, and illustrates the magnitude of threshold voltage shift at these worst case stress conditions (a.k.a., "burn-in") for the FETS circled in a storage cell, which are indicative of what can be seen from field use. For example, simulations of the storage cell in FIG. 2 estimate an NBTI-caused threshold voltage shift of 45 mV for the pull-up PFET device and a PBTI-caused threshold voltage shift contributing an additional 4.5 mV.

Figure 3:
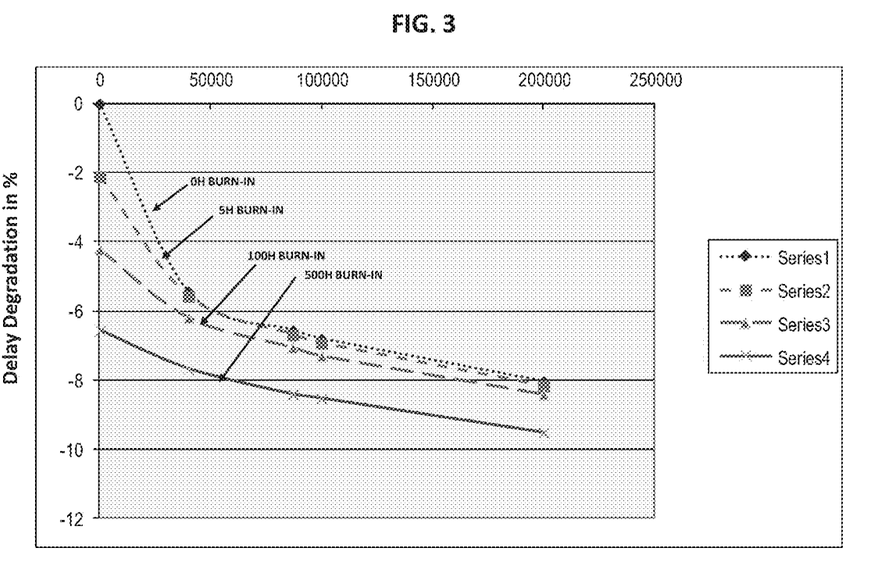
FIG. 3 shows a line graph illustrating threshold voltage shifts over the lifetime of an exemplary product.

NBTI and PBTI-caused threshold voltage shifts accumulate over time during which a FET is in a stress condition. As such, NBTI and PBTI-caused threshold voltage shifts can occur after a product has been fielded. FIG. 3 shows a line graph illustrating threshold voltage shifts over the lifetime of a product. The x-axis of the graph shows the number of hours the product is powered-on. The y-axis shows the relative amount of degradation (%) for different time periods in which the product remains in a state of burn-in. As shown, the degradation persists after 200,000 hours of operation, indicating that a threshold voltage shift introduced at time zero would persist until the end of the lifetime of the product. Changing the voltage state of a FET can allow it to recover from stress.

Figure 4:
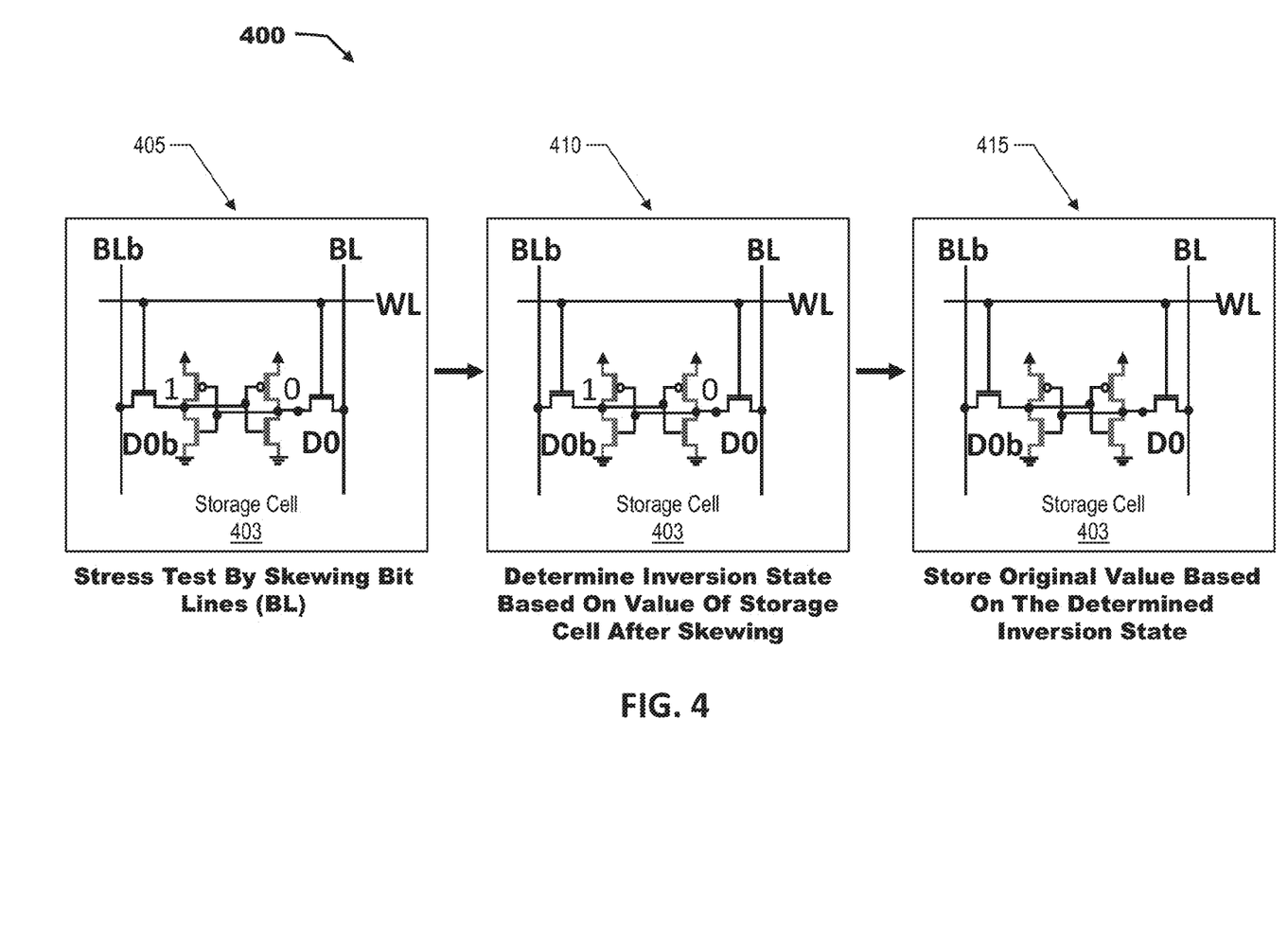
FIG. 4 is a block diagram of an exemplary process for characterization an exemplary storage cell in according with aspects of the invention.

FIG. 4 is a block diagram of an exemplary process 400 for performing in-field characterization of a storage cell 403 in according with aspects of the invention. In embodiments, storage cell 403 is a CMOS memory element including conventional bit lines BL and BLb and a word line WL. For example, the storage cell 403 may be an element of a SRAM. The bit lines BL and BLb are charged with respective reference voltages that can be skewed higher or lower above away from a nominal value to, for example, improve the read and/or write stability of the storage cell 403.

In accordance with aspects of the invention, the process 400 is performed during idle periods of a storage cell 403. At block 405, the storage cell 403 is stressed to characterize its NBTI and PBTI bias. At block 410, it is determined whether to invert the storage cell 403 or to keep the current state of the storage cell 403. At block 415, an original value of the storage cell 403 is stored in the storage cell 403 in one of an inverted state or a non-inverted state based on the determination made at block 410. In addition, as described below, an inversion indicator can also stored in associated with the storage cell 403 to record the determined inversion state (e.g., 0=not inverted, and 1=inverted).

More specifically, at block 405, a first stress test of a characterization process begins by writing high digital logic value (e.g., 1) to the storage cell 403. Stress is then introduced on the storage cell 403 by skewing voltages of bit lines BL and BLb lower (e.g., toward 0 V) to characterize the ability of the storage cell 403 to retain the high logic state. In embodiments, bit line BL is skewed from its reference voltage (e.g., 1 V) by an offset voltage ΔV and bit line BLb is held at its reference voltage (e.g., VDD), wherein offset voltage ΔV is equal to the threshold voltage of the storage cell 403 (i.e., source follower pre-charge ΔV=Vtn). After skewing the bit line BL and BLb, the value of the storage cell 403 is read to determine whether the state of the storage cell 403 changed (i.e., flipped) from the high digital logic state to a low digital logic state (i.e., from 1 to 0).

Additionally, a second stress test of the characterization process is performed in block 405 that is similar to the first step; however the second step uses the opposite values. That is, a low digital logic value (i.e., 0) is written to the storage cell 403. Stress is introduced on the storage cell 403 by skewing the bit lines BL and BLb higher (e.g., above 1 V) to characterize the ability of the storage cell 403 to retain the low digital logic state. After skewing the bit line BL and BLb, the value of the storage cell 403 is read to determine if the state of the cell were flipped from the low digital logic state to the high digital logic state (i.e., from 0 to 1).

At block 410, it is determined whether to invert the storage cell 403 based on the results of block 405. In embodiments, if the storage cell 403 changed states as a result of either stress test of block 405, then it is determined that storage cell 403 will be inverted to combat bias temperature instability-caused threshold voltage shifts.

At block 415, the original value of the storage cell 403 (i.e., the value stored in the cell before starting block 405), is restored in either a non-inverted or inverted state based on the determination in step 410. That is, if step 410 determined that the value of the storage cell 403 should be inverted, then the original value is inverted and that value is stored in the storage cell 403. However, if step 410 determined that the value of the storage cell 403 should not be inverted, then the original value is stored in the storage cell 403 without inverting it.

FIG. 4 illustrates a stress balancing process for a single storage cell 403. It is understood that the process 400 can be performed on more than one storage cell at a time. In accordance with aspects of the invention, the above process can be performed on a memory array on a word-by-word basis such that a number of storage cells included in a word line (e.g., word line WL) are characterized and inverted as a group. In such an embodiment, the memory array may originally store a word (e.g., 0101) in a number of storage cells (e.g., storage cell 403) included in a word line (e.g., word line WL). During an idle period, the original values stored in the storage cells along the word line (e.g., 0101) are read and stored (i.e., copied) in another memory location that is not currently included in the stress balancing process (e.g., another memory array).

In a manner similar to that described with regard to block 405, a high digital logic word (i.e., a word comprised of all 1's) is written to the storage cells along the word line in place of the original word (e.g., 0101). As a result, the predominate state of the storage cells along the word line have the value 1 and the desired predominate state of the storage cells to reverse NBTI and PTBI is the value 0. The storage cells along the word line WL are then stressed by skewing voltage of their bit lines BL and BLb lower. Next, the word is read and it is determined whether any bits of the word have flipped from 0 to 1. Any bits that have flipped (e.g., the second and fourth) can be considered unbalanced. In embodiments, if no flips occur, the skew of the bit lines can be increased until at least one of the storage cells in the word line flips or until a maximum skew is reached.

Also, in a manner similar to that described with regard to block 405, a low digital logic word (i.e., a word comprised of all 0's) is written to the storage cells along the word line. As a result, the predominate state of the storage cells of the word line have the value 0 and the desired predominate state of the cells to reverse NBTI and PTBI is the value 1. The storage cells along the word line are stressed by skewing their respective bit lines higher. After stressing, the storage cells along the word line are read and it is determined whether values of any storage cells along the word (e.g., 0000) have flipped from 0 to 1. Any bits that have flipped are considered unbalanced. As in the first step, if no flips occur, the skew of the bit lines can be increased until at least one of the storage cells along the word line flips or until a maximum skew is reached.

Next, in a manner similar to that described with regard to block 410, it is determined whether the storage cells along the word line should be inverted based on the results of the stress testing. In embodiments, the storage cells along the word line are inverted when it is determined that the number of bits that changed logic states after skewing exceed a predetermined threshold number. For, example, the inversion state can be changed when the number of storage cells that change logic state is greater than or equal to half of the number of storage cells along the word line (e.g., two or more). On the other hand, if less than half of the storage cells failed the stress tests of block 405, the inversion state can remain unchanged.

Then, in a manner similar to that described with regard to block 415, the original values stored in the storage cells along the word line are read back and stored in the storage cells along the word line based on the determined inversion state. That is, if it was determined that inversion state will be changed, then the original values are inverted (e.g., 0101 becomes 1010) and an inversion indicator value associated with the word line is changed. However, if it was determined that the inversion state will not be changed, then the original values are not inverted (e.g., 0101 remains 0101), and the value of the inversion indicator associated with the word line is not changed.

In the above example, the determination of whether to change the inversion state is based solely on the results of the stress testing. This process is most effective at stress balancing memory arrays with frequently changing data or an unknown change frequency. Alternatively, in embodiments of the invention, the process can use the results of the stress tests in conjunction with the original values stored in the storage cells along word line to determine whether a storage location should be inverted. This process can be used in stress balancing memory arrays that store static data, or data that is predominately static.

More specifically, the storage cells along the word line can be characterized in a manner similar to that described with regard to block 405. For example, in embodiments, it is determined whether the values of any storage cells along the word lines flipped from 1 to 0 and from 0 to 1 after the first stress test and the second stress test, respectively. Next, it is determined whether the storage cells along the word line should be inverted. In accordance with aspects of the invention, a bit-wise comparison is made between the values of those storage cells along the word line read after the stress tests (including any flipped bits) and the original values of the storage cells along the word lines. For example, the value of each of the flipped storage cells along the word line after the skewing can be compared with the original values of the storage cells along the word line. With respect to the first stress test, if any of the storage cells changed from 1 to 0, and if those storage cells originally had a value of 0, then the storage cells along the word line are determined to be unbalanced. With respect to the second stress test, if any of the storage cells along the word line flipped from 0 to 1, and if those storage cells originally had value of 0, then the storage cells along the word line are unbalanced. In the event that the word line is determined to include an unbalanced storage cell, the inversion state of the word line is changed. Otherwise, the current inversion state is retained.

In the exemplary embodiments above, the stress balancing is described as being performed on a cell-by-cell basis, and on a word-by-word basis. The invention is not limited to these divisions and can be performed, for example, on blocks of words. For example, a range of word lines in a memory array can be selected and balanced as a group. Additionally, a single word line can be characterized and the results may be applied to change to inversion states of other word lines (e.g., a block of adjacent word lines).

Figure 5:
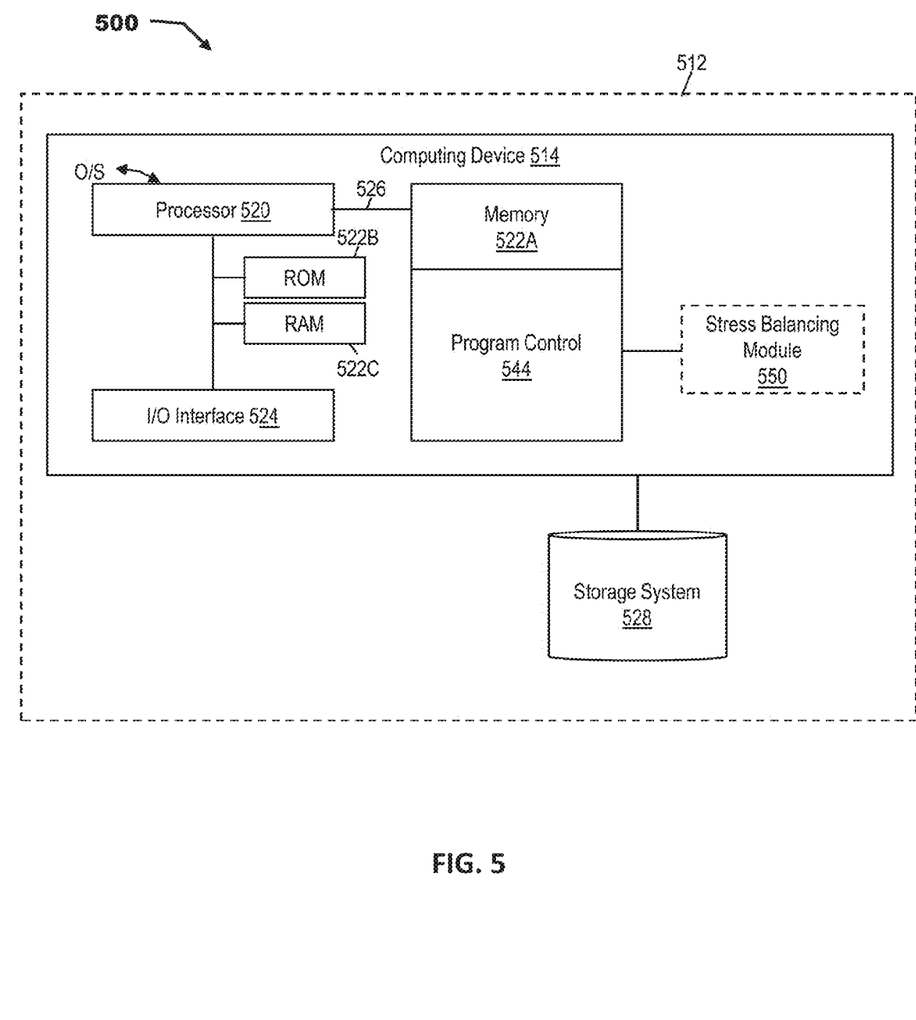
FIG. 5 shows an exemplary environment for implementing the steps in accordance with aspects of the invention.

FIG. 5 shows an exemplary environment 500 for implementing the steps in accordance with aspects of the invention. To this extent, the environment 500 includes a server or other computing infrastructure 512 that can perform the processes described herein. In particular, the computer infrastructure 512 includes a computing device 514. The computing device 514 can be resident on a network infrastructure or computing device of a third party service provider (any of which is generally represented in FIG. 5).

The computing device 514 also includes a processor 520, memory 522A, an I/O interface 524, and a bus 526. The memory 522A can include local memory employed during actual execution of program code, bulk storage, and cache memories which provide temporary storage of at least some program code in order to reduce the number of times code must be retrieved from bulk storage during execution. In addition, the computing device includes a read-only memory (ROM) 522B, a random access memory (RAM) 522C (e.g., SRAM), and an operating system (O/S). The computing device 514 is in communication with a storage system 528. Bus 526 provides a communication link between each of the components in computing device 514.

In general, processor 520 executes computer program code (e.g., program control 544), which can be stored in the memory 522A and/or storage system 528. Moreover, in accordance with aspects of the invention, program control 544 controls a stress balancing module 550 to perform one or more of the processes described herein. Stress balancing module 550 can be implemented as one or more sets of program code in the program control 544 stored in memory 522A as separate or combined modules. Additionally, stress balancing module 550 can be implemented as a state machine, as separate dedicated processors, or a single or several processors to provide the functionality described herein.

While executing the computer program code, the processor 520 can read and/or write data to/from memory 522A, 522B, and 522C and storage system 528. The program code executes the processes of the invention, for example, stress balancing module 550. In embodiments of the invention, stress balancing module 550 is computer program code stored in, for example, memory 522A and/or 522B that, when executed by the processor 520, causes computing device 514 to perform stress balancing of storage devices (e.g., memory 522C).

In accordance with aspects of the invention, the stress balancing module 550 is configured to characterize the stress of a storage location (e.g., a word line) in a memory array (e.g., memory 522C) by skewing bit line voltages of the storage location (e.g., in a manner similar to that described with respect to FIG. 4). Based on the characterizing, the stress balancing module 550 can determine that the location is unbalanced and invert a logic state of the storage location to combat bias temperature instability-caused threshold voltage shifts. For example, the stress balancing module 550 can invert storage cells along a word line and store an associated value (e.g., an inversion indictor) indicating the inversion state of the storage cells along the word line.

Additionally, in accordance with aspects of the invention, the stress balancing module 550 is configured to determine a storage location (e.g., a storage cell, storage cells along a word line, or a block of words along word lines) in a memory device (e.g., memory 522C) is inverted based on a value of an inversion indicator that solely corresponds to the storage location, and can invert values read or written to the storage location. In embodiments, the stress balancing module 550 is physically or functionally in the read and/or write pathways of the computing device 514 and performs modified read and write functions based on an inversion state of a word line in a way that is transparent to other code such that source code (e.g., program control 544) does not need to be modified to accommodate the functionality of the stress balancing module 550.

The computing device 514 can comprise any general purpose computing article of manufacture capable of executing computer program code installed thereon (e.g., a personal computer, server, etc.). However, it is understood that the computing device 514 is only representative of various possible equivalent-computing devices that may perform the processes described herein. To this extent, in embodiments, the functionality provided by the computing device 514 can be implemented by a computing article of manufacture that includes any combination of general and/or specific purpose hardware and/or computer program code. In each embodiment, the program code and hardware can be created using standard programming and engineering techniques, respectively.

Similarly, computing infrastructure 512 is only illustrative of various types of computer infrastructures for implementing the invention. For example, in embodiments, the computing infrastructure 512 comprises two or more computing devices (e.g., a server cluster) that communicate over any type of communications link, such as a network, a shared memory, or the like, to perform the process described herein. Further, while performing the processes described herein, one or more computing devices on computing infrastructure 512 can communicate with one or more other computing devices external to computing infrastructure 512 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 6:
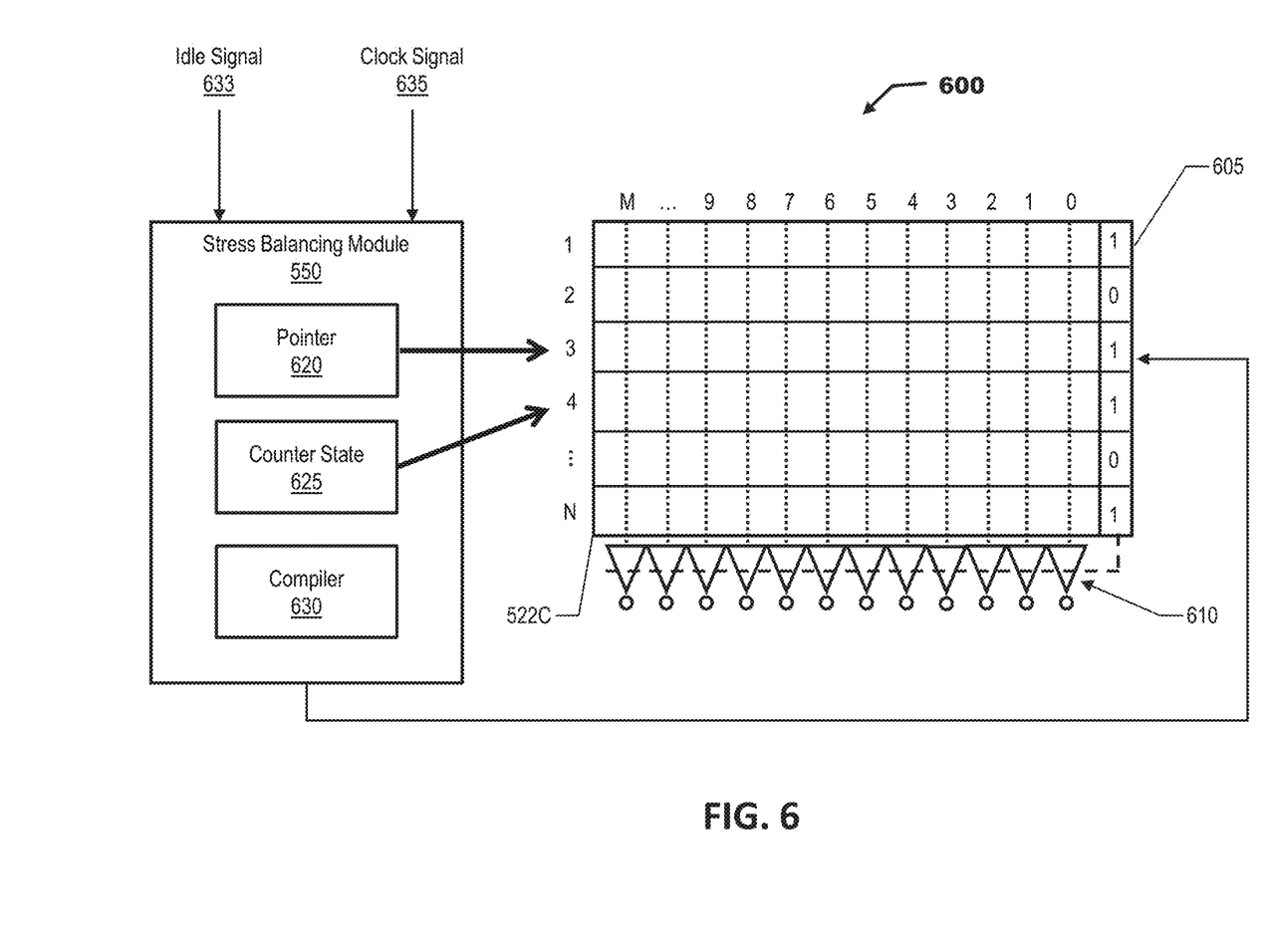
FIG. 6 shows an exemplary system for stress balancing storage cells in accordance with aspects of the invention.

FIG. 6 shows an exemplary system 600 for stress balancing storage cells in accordance with aspects of the invention. In embodiments, the system 600 performs stress balancing on storage cells along word lines 0, 1 . . . N in RAM 522C. For example, the system 600 may sequentially stress test storages cells along each word line 0 . . . N of the RAM 522C and, based on the results, invert the data stored in the storage cells along individual word lines 0 . . . N.

RAM 522C is, for example, a SRAM. In accordance with aspects of the invention RAM 522C includes an array of storage cells configured as words along word lines 0 . . . N and bit lines 0 . . . M in rows and columns, as in a conventional SRAM array. Additionally, in accordance with aspects of the invention, each word line 0 . . . N is associated with a corresponding one of inversion bits 605. In embodiments, the inversion bits 605 are stored in a particular column of the RAM 522C (e.g., the least significant bit). In other embodiments, the inversion bits 605 are stored in a separate structure (e.g., a data register) associated with the RAM 522C. The inversion bits 605 indicate the inversion state of the corresponding word lines 0 . . . N. For example, if a particular inversion bit has a value of 0, then corresponding words along word lines 0 . . . N are not inverted. However, if the particular bit has a value of 1, then the word along a corresponding one of word lines 0 . . . N is inverted.

Each of the bit lines 0 . . . M is associated with a respective one of output buffers 610, as in a conventional memory array. In accordance with aspects of the invention, the output buffers 610 are configured to selectively invert the values of words along bit lines 0 . . . M based on the inversion bits 605. In embodiments, when a particular one of word lines 0 . . . N is selected for reading, the corresponding one of inversion bits 605 controls the output buffers 610 to invert or not invert the read word based on the corresponding inversion bit. For example, if the corresponding one of inversions bits 605 has a value of 1, then output buffers can invert a word read from RAM 522C.

In accordance with aspects of the invention, the stress balancing module 550 is comprised of hardware, software, or a combination thereof that dynamically controls a stress balancing processes (e.g., process 400). The stress balancing module 550 maintains a pointer 620 and a counter state 625 for controlling stress balancing functions. Pointer 620 is a register or array location (e.g., in RAM 522C) that stores a row pointer to a current one of word lines 0 . . . N in RAM 522C. Accordingly, the number of bits used for the pointer corresponds to the number of word lines in the RAM 522C (e.g., the number of bits+roundup (log2(N)). For example, when the stress balancing module 550 is currently stress testing word line 3, then the pointer 550 stores a value corresponding to the address of word line 3 (e.g., 0011 in binary notation). Based on the pointer, the value stored in the current word of word lines 0 . . . N can be read, stored elsewhere, and rewritten during the stress balancing process. While the pointer 620 is illustrated in FIG. 6 as corresponding to a single word of word lines 0 . . . N, it is understood that, in embodiments, the pointer 620 may include more than one address corresponding to a number of word lines (e.g., a block of word lines).

In embodiments, counter state 625 is a register or array location (e.g., in RAM 522A) maintained by the stress balancing module 550 that indicates the word line where the stress balancing process left off at the last idle state operation. As such, the number of bits used for the pointer corresponds to the number of word lines in the RAM 522C (e.g., the number of bits+roundup (log2(N)). For example, when the stress balancing module 550 last performed a stress balancing operation on word line 3 and is awaiting an idle period to continue the stress balancing process, the counter state 625 can store the address the next word line (i.e., word line 4) in the sequence of word lines 0 . . . N.

While the counter 625 is illustrated in FIG. 6 as corresponding to a single word of word lines 0 . . . N, it is understood that, in embodiments, the counter 625 may include more than one address corresponding to a number words of word lines (e.g., a block of word lines).

In embodiments, the stress balancing module 550 includes a compiler 630 to create machine code for the SRAM 522C. For example, using the compiler 630, the stress balancing module 550 can perform a modified write function that replaces all compiled read operations, wherein the write function writes an inverted or non-inverted memory state based upon inversion indicators 605 of each word along word lines 0 . . . N. Additionally, using the compiler 630, the stress balancing module 550 can execute a modified read function to replace all compiled memory read operations, wherein the write function reads an inverted or non-inverted memory state based upon the inversion indicators 605 of each word along word lines 0 . . . N.

In accordance with aspects of the invention, the stress balancing module 550 is configured to monitor RAM 522C for idle states to identify opportunities for the algorithm to run without interruption of other code running. In embodiments, the stress balancing module may receive an idle signal 633 from a memory controller that indicates that the RAM 522C is in an idle state. Alternatively, the stress balancing module may determine that a current one of word lines 0 . . . N is in an idle state based on a clock signal 635. For example, the stress balancing module 550 can periodically read the value of word line 3 and, if the value has not changed within a predetermined amount of time, the stress balancing module 550 can determine that word line 3 is idle.

Additionally, the stress balancing module 550 is configured to perform a stress balancing process in a manner similar to the performed by process 400. In embodiments, the stress balancing module 550 sequentially characterizes storage cells along word lines 0 . . . N in a manner similar to block 405, determines if inversion storage cells along of particular ones of the word lines 0 . . . N is necessary based on characterization results in a manner similar to block 410, and inverts the storage cells along the word lines in a manner similar to block 415.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable mediums having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
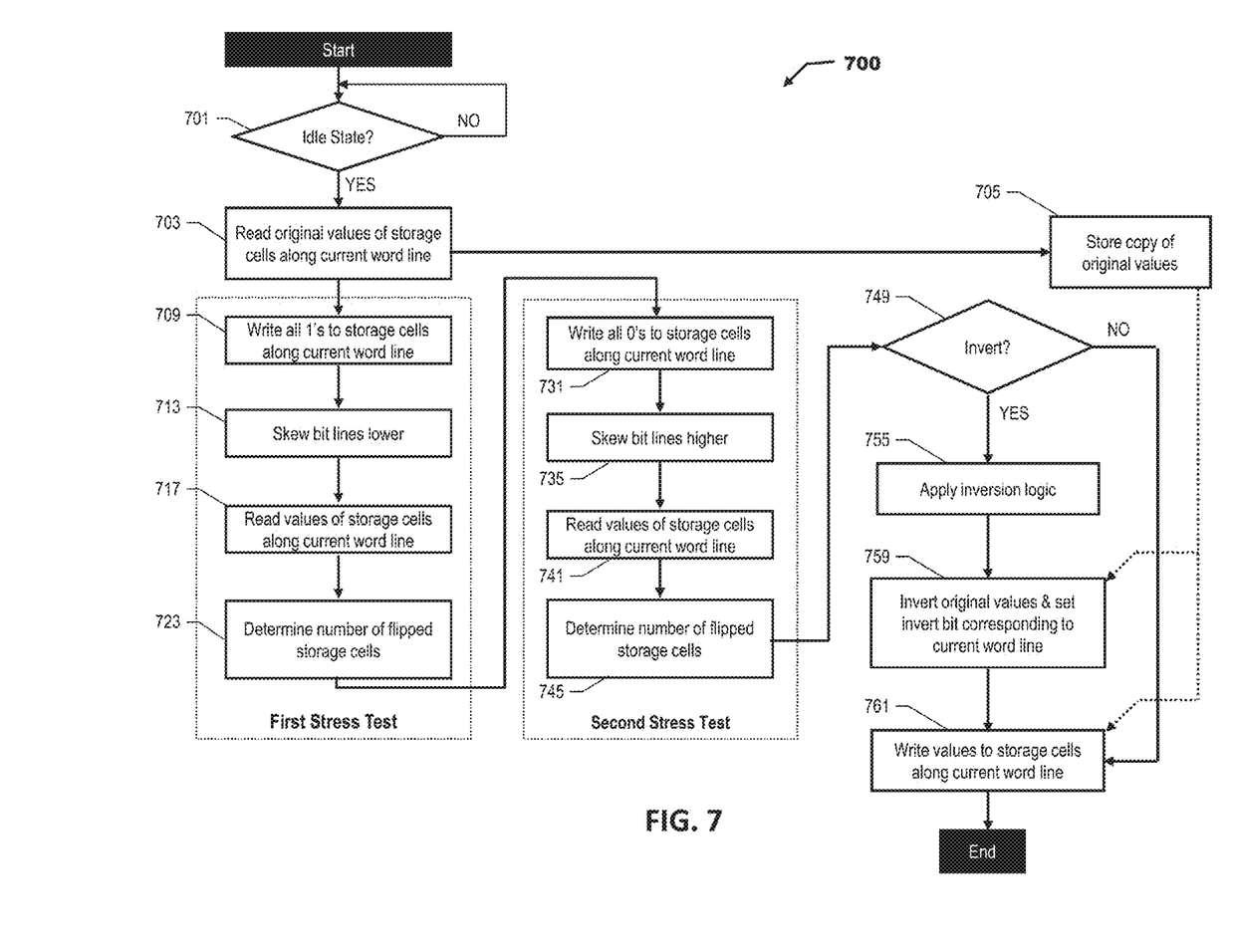
FIG. 7 shows an exemplary process flow for performing aspects of the present invention.
Figure 8:
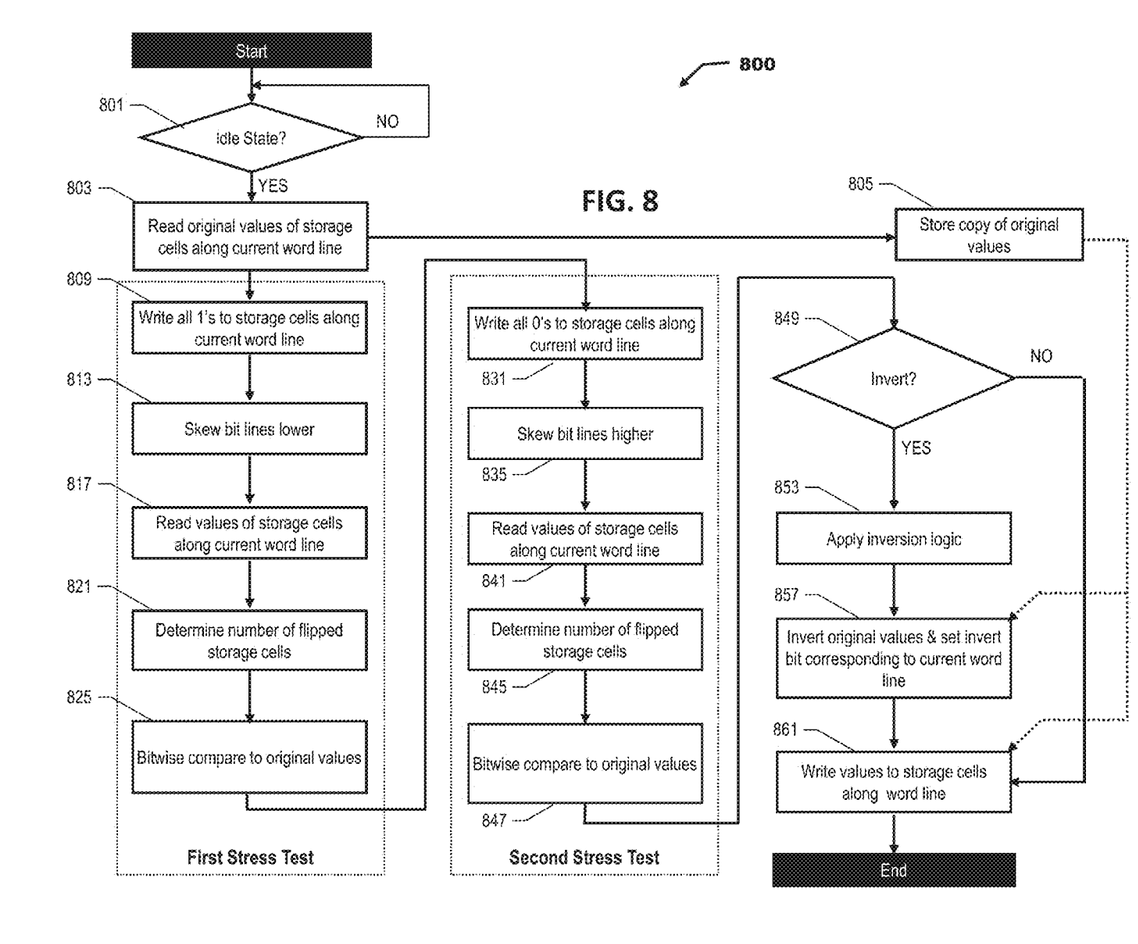
FIG. 8 shows an exemplary process flow for performing aspects of the present invention.

FIGS. 7 and 8 show exemplary process flows for performing aspects of the present invention. The steps of FIGS. 7 and 8 can be implemented in the environment of FIG. 5 and the system of FIG. 6 to stress balance a storage device (e.g., RAM 522C).

The flowchart in FIGS. 7 and 8 illustrate the architecture, functionality, and operation of possible implementations of systems, methods, and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 7 depicts an exemplary flow of a process 700 for stress balancing storage cells of a memory device (e.g., SRAM 522C) in accordance with aspects of the invention. In embodiments, the process 700 is used in devices that do not store static information. For example, the process 700 may be used on memory devices that do not store the same information for long periods of time (e.g., more than 100 hours).

At step 701, a system (e.g., a state machine executing stress balancing module 550) or an automated process (e.g., computing device 514 executing stress balancing module 550) determines whether one or more words lines (e.g., word lines 0 ... N) stored in a memory (e.g., RAM 522C) are idle (i.e., unchanged for more than a predetermined period of time). For example, the determination can be based on an idle indicator (e.g., idle signal 633) and/or a counter (e.g., clock signal 635). If the one or more words lines are not in an idle state (i.e., step 701, "No"), then the process can cycle while awaiting an idle state. If the one or more words lines are in an idle state (i.e., step 701, "Yes"), then the system or the automated process begins stress balancing a current word of the memory in accordance with aspects of the present invention.

At step 703, based on the determination at step 701, the system or the automated process reads original values of the storage cells along a current word line. In embodiments, the current word line is determined based on a value stored by the system or the automated process (e.g., the value of counter 625), which is the next in a sequence of word lines (e.g., word lines 0 ... N). At step 705, the system or the automated process stores the original values of the storage cells along the current word line in another location (e.g., memory 522A). Additionally, the system or the automated process stores the address of the current word line (e.g., pointer 620). By doing so, the original values of the storage cells along the current word line can be recovered after stress testing.

Next, the system or the automated process initiates a first stress test (e.g., in a manner similar to block 405) to characterize the fatigue of the storage cells (e.g., storage cell 403) along the current word line due to NBTI and PBTI. At step 709, the system or the automated process writes a word comprised of all 1s in place of the original values of the storage cells along the current word line (e.g., at the address stored by pointer 620). At step 713, the system or the automated process skews the bit lines (e.g., bit lines BL and BLb) lower (e.g., toward zero volts). At step 717, after the skewing, the system or the automated process reads the values of the storage cells along the current word line. At step 723, the system or the automated process determines the number storage cells along the current word line that have failed the stress test (i.e., the storage cells having values that changed from 1 to 0).

After completing the first stress test, in embodiments of the invention, a second stress test begins (e.g., in a manner similar to that in block 405) to characterize the fatigue of the storage cells in the current word line due to NBTI and PBTI. At step 731, the system or the automated process writes a word comprised of all 0s to the storage cells along the current word line. At step 735, the system or the automated process skews the bit lines (e.g., bit lines 0 ... M) higher toward a maximum voltage (e.g., a supply voltage VDD). At step 741, the system or the automated process reads the values of the storage cells along the current word line. At step 745, the system or the automated process determines the number storage cells along the word that have failed the stress test (i.e., the storage cells having values that changed from 0 to 1).

At step 749, the system or the automated process determines whether to invert the storage cells along the current word line based on the results of the stress tests at step 723 and step 745. In embodiments, the system or the automated process determines to invert the storage cells along the current word line if a number of the storage cells that failed the first stress test and/or the second stress test exceed a predetermined threshold value (e.g., ≥50%). For example, in a four-bit word, the system or the automated process determines whether the total number of storage cells that failed in the first stress test and the second stress test is greater than or equal to two. If not (i.e., step 749, "No"), then at step 761, the original values of the storage cells along the current word line are read at step 703 are written back to its location without being inverted and without changing the corresponding inversion indicator. However, if at step 749 it is determined the total number of storage cells that failed in the first stress test and the second stress test meets or exceeds the threshold value (i.e., step 749, "Yes"), then at step 755, the system or the automated process applies inversion logic. Accordingly, at step 759, the system or the automated process inverts the values of the storage cells stored at step 705 and sets an invert bit for the current word line in the memory (e.g., in a manner similar to block 415). For example, the values are inverted by switching the logic state of each of the storage cells along the current word line. At step 761, the values inverted in step 759 are written back to the storage cells along the current word line.

FIG. 8 depicts a flow of an exemplary process 800 for stress balancing storage cells of a memory device in accordance with aspects of the invention. In embodiments, the system or the automated process 800 is used in devices that are not static. For example, the system or the automated process 800 may be used on memory devices that do not store the same information for long periods of time (e.g., more than 100 hours).

At step 801, the system or the automated process determines whether one or more words lines (e.g., word lines 0 ... N) stored in a memory (e.g., RAM 522C) are in an idle state in a same or similar manner as in step 701. At step 803, the system or the automated process reads original values of the storage cells along a word line that is in an idle state. At step 805, the system or the automated process stores a copy of the original values of the storage cells along the current word line in another location (e.g., memory 522A) in a same or similar manner as in steps 703 and 705.

Aspects of the first stress test performed in steps 809, 813, 817, and 821, and the second stress test performed in steps 831, 835, 843, and 845 may be the same as or similar to those performed at steps 709, 713, 717, and 717, and at steps 731, 735, 741, and 745 of process 700, respectively. At step 809, the system or the automated process writes a word comprised of all is in the memory in place the original values of the storage cells along the current word line. At step 813, the system or the automated process skews the bit lines of the memory lower (e.g., toward zero volts). At step 817, the system or the automated process reads the values of the storage cells along the current word line. At step 821, the system or the automated process determines the storage cells along the current word that have failed (i.e., the storage cells having values that changed from 1 to 0). At step 825, the system or the automated process performs a bit-to-bit comparison between the values of the failing storage cells and the original values of the storage cells stored in step 805. Thus, in the process 800, the system or automated process takes the original values of the storage cells into account when stress balancing, which can be more effective than the process 700 in devices that store static information. In accordance with aspects the invention, the system or the automated process determines whether a failed storage cell (i.e., one that changed from 1 to 0) was had a low logic state (i.e., 0) in the original value of the storage cell.

Next, the second stress test begins (e.g., the second stress test of block 405). That is, at step 831, the system or the automated process writes a word comprised of all 0s to the storage cells along the current word line. At step 835, the system or the automated process skews the bit lines higher (e.g., toward a maximum supply voltage). At step 841, the system or the automated process reads the values of the storage cells along the current word line. At step 845, the system or the automated process determines the storage cells that have failed (i.e., the storage cells having values that changed from 0 to 1). At step 847, the system or the automated process performs a bit-to-bit comparison between the values of the failing storage cells and the original values of those storage cells stored in step 805. As such, in the process 800, the system or automated process takes the original values of the storage cells along the current word line into account when stress balancing, which can be more effective than the process 700 in devices that store static information. In accordance with aspects the invention, the system or the automated process determines whether a failed storage cell (i.e., one that changed from 1 to 0) was had a low logic state (i.e., 0) in the original word.

At step 849, the system or the automated process determines whether or not to invert storage cells along the current word line. In accordance with aspects of the invention, the system or the automated process determines whether to invert the storage cells along the current word line based on the result of the stress tests performed in steps 825 and steps 847, as well as the original values of those storage cells, which was stored word at step 805. That is, if any of the storage cells flipped from 1 to 0 were originally a 0, as determined at step 825, then the system determines that the word line is unbalanced and that the storage cells along the word line will be inverted. On the other hand, the storage cells along the word line are not flipped on when it is determined that a storage cell that flipped from 1 to 0 was originally a 1. Additionally, if any of the storage cells flipped from 0 to 1 were originally a 1, as determined at step 847, then the system determines that the word line is balanced and, thus, determines that the storage cells along the word line should not be inverted. That is, the storage cells of the word line are not flipped when it is determined that a storage cell that flipped from 0 to 1 was originally a 1. However, if storage cells that originally stored a 0 flipped from 0 to 1, then the storage cells of the word line are inverted.

If the system or the automated process determines not to invert the storage cells along the current word line (i.e., step 849, "No"), then at step 861 the system retrieves the copy of the original values of the storage cells stored at step 805 and writes the original values back to storage cells along the current word line without being inverted and without changing an invert bit for that word line in the memory. However, if the system determines to invert the storage cells along the current word line (i.e., step 849, "Yes"), then at step 853 the system or the automated process applies inversion logic. Accordingly, at step 857, the system or the automated process retrieves the original values of the storage cells stored at step 805, inverts the their values, and sets an invert bit for the current word line in the memory. At step 861, the values inverted in step 851 are written back to the storage cells along the current word line.

Figure 9:
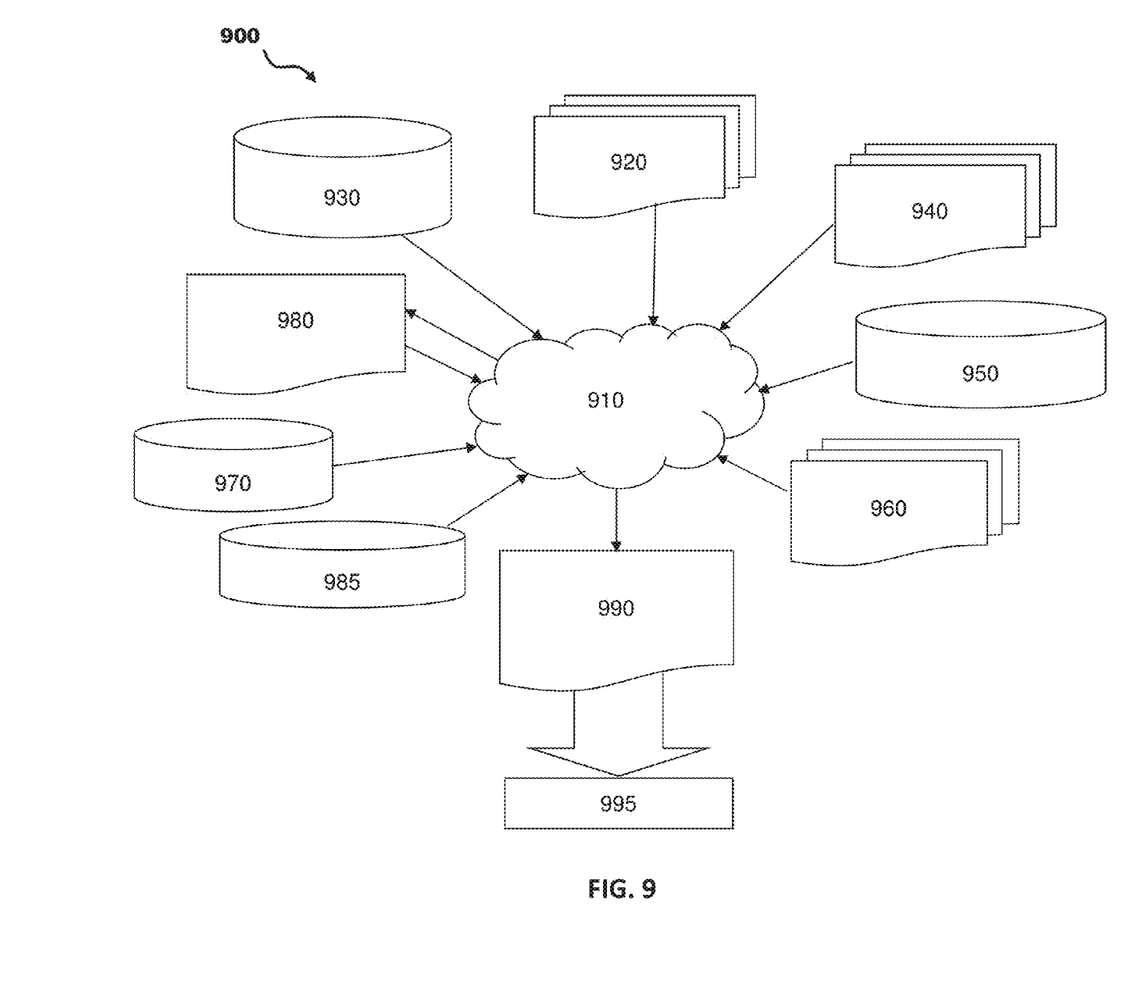
FIG. 9 shows a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 6. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 6. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 6 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 6. In one embodiment, design structure 990 may comprise a compiled, executable HDL simulation model that functionally simulates the devices shown in FIG. 6.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 6. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method for stress balancing circuits comprising:
characterizing fatigue of a location in a memory array by skewing a bit line voltage of the location;
determining that the location is unbalanced based on the characterizing;
inverting a logic state of the location; and
changing a value of an inversion indicator corresponding to the location.

2. The method of claim 1 further comprising, before the characterizing:
determining that the location is idle; and
storing an original value of the location in another location.

3. The method of claim 1, wherein the characterizing comprises:
setting the location to a first digital logic state;
performing the skewing of the bits line voltage of the location after the setting; and
determining that the location changed from the first digital logic state to a second logic state after the skewing.

4. The method of claim 3, wherein:
the setting comprises writing a high digital logic state to the location;
the skewing comprises reducing the bit line voltage provided to the location; and
the determining that the location changed comprises determining that the location has a low digital logic state after the skewing.

5. The method of claim 3, wherein:
the setting comprises writing a low digital logic state to the location;
the skewing comprises increasing the bit line voltage provided to the location; and
the determining that the location changed comprises determining that the location has a high digital logic state after the skewing.

6. The method of claim 3, wherein:
the location includes a plurality of storage cells; and
the determining that the location is unbalanced comprises determining that a number of the plurality of storage cells that changed from the first logic state to the second logic state exceeds a threshold value.

7. The method of claim 3, wherein:
the determining that the location is unbalanced comprises bit-wise comparing a value of the location after the skewing to an original value of the location; and
the inverting the logic state of the location comprises one of:
inverting the logic state of the original value when the value of the location after the skewing includes at least one bit that changed from a high logic state to a low logic state, and the original value of the at least one bit was a low logic state; and
inverting the logic state of the original value when the value of the location after the skewing includes at least one bit that changed from a low logic state to a high logic state, and the original value of the at least one bit was a low logic state.

8. The method of claim 1, wherein the inverting the logic state of the location comprises:
inverting the original value of the location; and
storing the inverted original value in the location.

9. The method of claim 1, wherein:
the memory array is a static random access memory (SRAM);
the location is a first word line of a plurality of word lines included in the SRAM;
each of the plurality of word lines is associated with a corresponding one of a plurality of inversion indictors;
the method further comprises, before the characterizing:
determining that the location is idle; and
storing an original value of the location in another location; and
the inverting comprises:
inverting the original value based on the inversion indicator; and
writing the inverted original value to the location.

10. A computer program product comprising a computer usable storage device having a computer readable program stored in the device, wherein the computer readable program, when executed on a computing device, is operable to cause the computing device to:
determine respective inversion state indicators corresponding to a plurality of locations in a memory array;
determine that a first storage location of the plurality of locations in the memory array is inverted based on a value of the corresponding one of the inversion state indicators;
invert values written to the first storage location based on the value of the corresponding one of the inversion state indicators; and
invert values read from the first storage location based on the corresponding one of the inversion state indicators.

11. The computer program product of claim 10, wherein:
the memory array is a static random access memory (SRAM);
the first storage location is a first word line of a plurality of word lines in the SRAM; and
each of the plurality of word lines is associated with a respective one of a plurality of inversion indictors.

12. A structure for stress balancing circuits comprising:
a stress balancing module;
an array of storage cells comprising:
a plurality of word lines that are rows of the array; and
a plurality of bit lines that are columns of the array, wherein the bit lines have adjustable voltages;
a memory device storing a plurality of inversion indicators that correspond, respectively, to the plurality of word lines; and
a plurality of output buffers configured to selectively invert the plurality of bit lines based on the plurality of inversion indicators.

13. The structure of claim 12, wherein the stress balancing module is configured to:
characterize negative bias temperature instability (NBTI) and positive bias temperature instability (PBTI) stress of the plurality of word lines; and
determine the plurality of inversion indicators based on the characterized stress of storage cells along the plurality of word lines.

14. The structure of claim 13, wherein the stress balancing module is configured to characterize the stress of the storage cells along the plurality of word lines by:
writing a word having a first digital logic state to storage cells along a first word line of the plurality of word lines;
skewing a reference voltage of the plurality of bits lines; and determining that one or more of the storage cells along the first word line changed from the first digital logic state to a second logic state after the skewing.

15. The structure of claim 14, wherein:
the word having the first digital logic state consists entirely of bits having a high digital logic state;
the skewing the reference voltage comprises reducing the reference voltage; and
the determining that the one or more storage cells along the first word line changed comprises determining that the one or more storage cells along the first word line have a low logic state value.

16. The structure of claim 14, wherein:
the word having the first digital logic state consists entirely of bits having a low digital logic state;
the skewing the reference voltage comprises increasing the reference voltage; and
the determining that the one or more storage cells along the first word line changed comprises determining that the one or more storage cells along the first word line have a high logic state value.

17. The structure of claim 14, wherein the stress balancing module is configured to determine a first inversion indicator of the plurality of inversion indicators that corresponds to the first word line by determining that a number of the one or more storage cells along the first word line changed from the first digital logic state to the second digital logic state exceeds a threshold value.

18. The structure of claim 14, wherein the stress balancing module is configured to determine a first inversion indicator of the plurality of inversion indicators that corresponds to the first word line by:
bit-wise comparing values of the storage cells along the first word line after the skewing to original values of the storage cells along the first word line;
determining whether the storage cells along the first word include at least one storage cell that flipped from a high digital logic state to a low digital logic state, and that the at least one storage cell had a low logic state in the original values; and
determining whether the storage cells along the first word include at least one storage cell that flipped from a low digital logic state to a high digital logic state, and that the at least one storage cell had a low logic state in the original values.

19. The structure of claim 12, wherein the stress balancing module is configured to:
determine that the one or more of the plurality of word lines is idle; and
copy values stored in the one or more word lines to another location.

20. The structure of claim 12, wherein:
the array of storage cells is a static random access memory (SRAM); and
the stress balancing module is a state machine.

* * * * *